(12) United States Patent
Muhlenbrock

(10) Patent No.: US 9,627,978 B2
(45) Date of Patent: Apr. 18, 2017

(54) CIRCUIT ARRANGEMENT AND METHOD FOR ASCERTAINING SWITCHING TIMES FOR A DC-DC VOLTAGE CONVERTER

(71) Applicant: Conti Temic Microelectronic GmbH, Nuremberg (DE)

(72) Inventor: Peter Muhlenbrock, Nuremberg (DE)

(73) Assignee: CONTINENTAL AUTOMOTIVE GMBH, Hannover (DE)

( * ) Notice: Subject to any disclaimer, the term of this patent is extended or adjusted under 35 U.S.C. 154(b) by 319 days.

(21) Appl. No.: 14/360,670

(22) PCT Filed: Nov. 29, 2012

(86) PCT No.: PCT/EP2012/073967
§ 371 (c)(1),
(2) Date: May 27, 2014

(87) PCT Pub. No.: WO2013/079595
PCT Pub. Date: Jun. 6, 2013

(65) Prior Publication Data
US 2015/0188439 A1    Jul. 2, 2015

(30) Foreign Application Priority Data
Dec. 2, 2011    (DE) .................. 10 2011 087 668

(51) Int. Cl.
H02M 3/00 (2006.01)
H02M 3/335 (2006.01)
G01R 31/40 (2014.01)

(52) U.S. Cl.
CPC ... H02M 3/33507 (2013.01); H02M 3/33592 (2013.01); G01R 31/40 (2013.01); Y02B 70/1475 (2013.01)

(58) Field of Classification Search
CPC ........... H02M 1/32; H02M 2001/0009; H02M 3/1584; H02M 7/53875;
(Continued)

(56) References Cited

U.S. PATENT DOCUMENTS 7,710,094 B1 *  5/2010  Wong ................ H02M 3/156
                                          323/225
7,889,524 B2    2/2011  Lee et al. ................ 363/65
(Continued)

FOREIGN PATENT DOCUMENTS

DE        4301605 C1      5/1994    .............. H02M 1/08
WO    2013/079595 A2      6/2013

*Primary Examiner* — Adolf Berhane
*Assistant Examiner* — Henry Lee, III
(74) *Attorney, Agent, or Firm* — Slayden Grubert Beard PLLC

(57) ABSTRACT

A circuit arrangement is disclosed for ascertaining switching times for a DC-DC voltage converter which has an actuating unit, configured to actuate circuit breakers in a full bridge which are arranged on a high-voltage side of the DC-DC voltage converter. In addition, the circuit arrangement has at least one comparison unit which is configured to compare a first voltage U dropping across a circuit breaker arranged on a low-voltage side of the DC-DC voltage converter with a first predetermined reference voltage U. In addition, the circuit arrangement has a first measuring unit, configured to start a first time measurement when a pair of the circuit breakers in the full bridge is switched on by the actuating unit and to terminate the first time measurement when U>U. The first measuring unit is also configured to output an ascertained first measurement period for the first time measurement to the actuating unit, and the actuating unit is configured to actuate the circuit breakers on the basis of the ascertained first measurement period.

5 Claims, 6 Drawing Sheets

(58) Field of Classification Search
CPC . H02M 2001/0032; H02M 2001/0048; H02M 2001/0054; H02P 27/06; H02P 2101/45; H02P 21/0003; H02P 2209/09; H02P 23/0027; H02P 27/08; H02P 6/085
See application file for complete search history.

(56) References Cited

U.S. PATENT DOCUMENTS

| | | | |
|---|---|---|---|
| 8,416,597 B2 * | 4/2013 | Adragna | H02M 3/33592 363/127 |
| 2011/0018521 A1 * | 1/2011 | Jonsson | H02M 7/53873 323/311 |
| 2012/0049828 A1 * | 3/2012 | Hara | H02M 3/1588 323/284 |

* cited by examiner

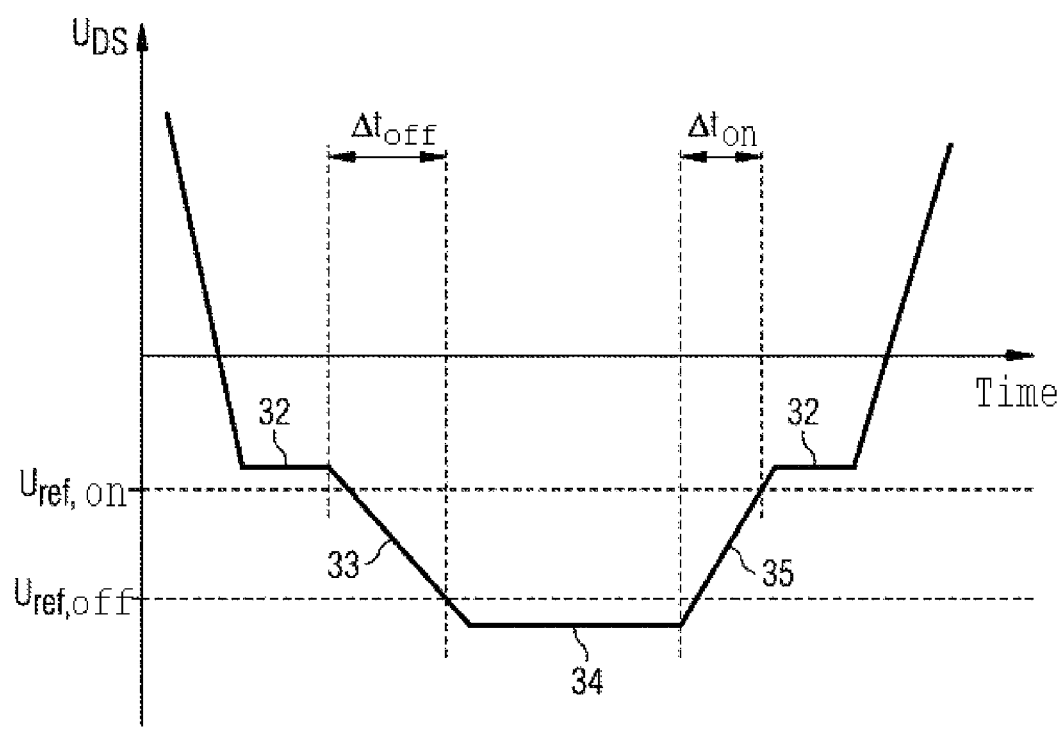

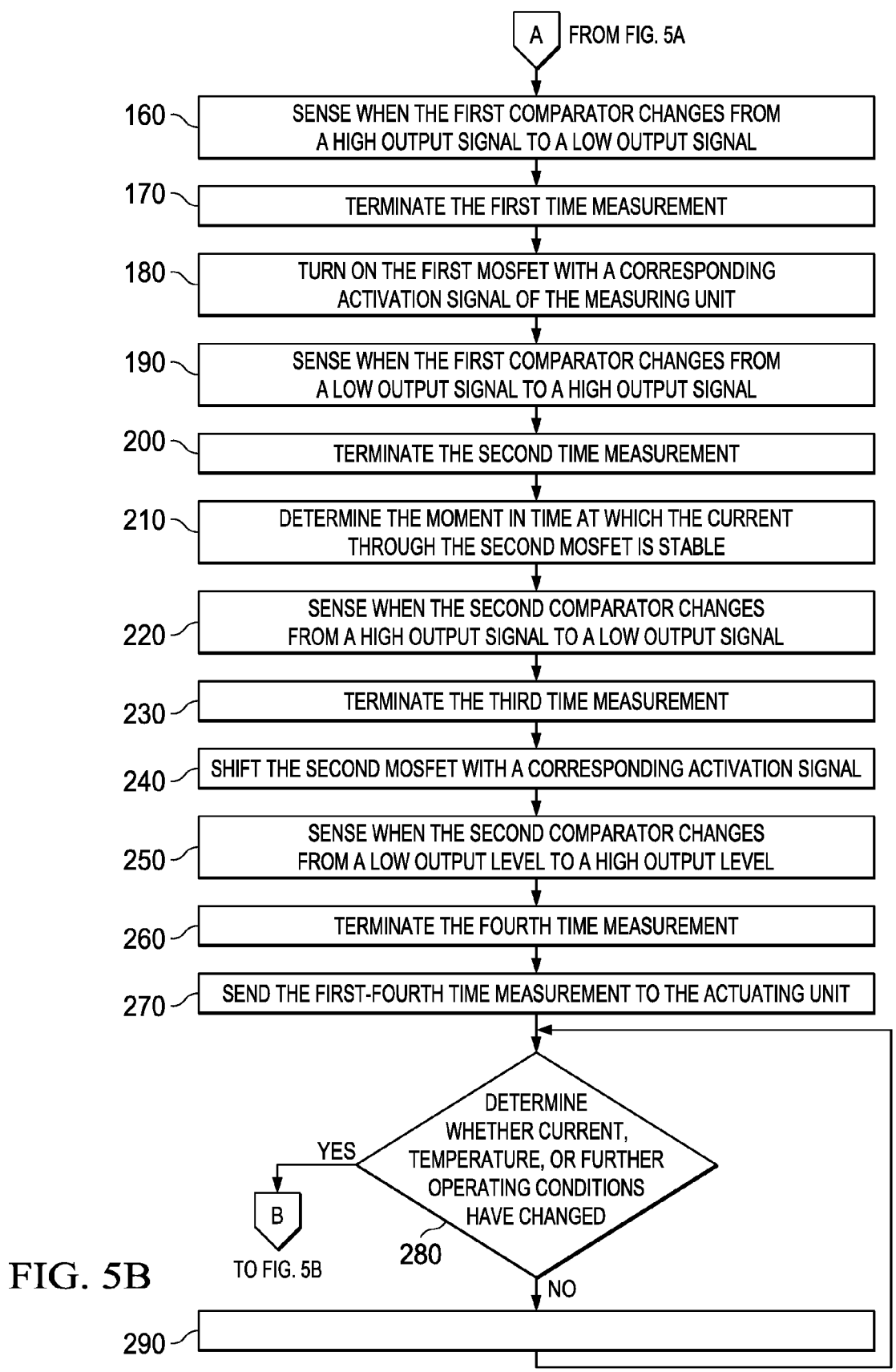

CIRCUIT ARRANGEMENT AND METHOD FOR ASCERTAINING SWITCHING TIMES FOR A DC-DC VOLTAGE CONVERTER

CROSS-REFERENCE TO RELATED APPLICATIONS

This application is a U.S. National Stage Application of International Application No. PCT/EP2012/073967 filed Nov. 29, 2012, which designates the United States of America, and claims priority to DE Application No. 10 2011 087 668.5 filed Dec. 2, 2011, the contents of which are hereby incorporated by reference in their entirety.

TECHNICAL FIELD

The application relates to circuit arrangements and methods for ascertaining switching times for a DC-DC voltage converter, to a DC-DC voltage converter, and to a vehicle on-board power supply system comprising a DC-DC voltage converter.

BACKGROUND

U.S. Pat. No. 7,889,524 B2 discloses a power module for a hybrid electric vehicle with an integrated converter, which comprises a rectifier for converting AC voltage into DC voltage, a DC-DC voltage converter for converting a first voltage into a second voltage, and a battery for storing electric energy. The integrated converter operates in three modes: 1) AC charging mode, 2) boost mode for supplying power from the battery to the electric bus, and 3) buck mode for supplying power from the electric bus to the battery.

SUMMARY

One embodiment provides a circuit arrangement for ascertaining switching times for a DC-DC voltage converter, comprising an actuating unit, designed to actuate circuit breakers in a full bridge, which are arranged on a high-volt side of the DC-DC voltage converter, at least one first comparison unit, designed to compare a first voltage $U_{LV}$ dropping across a circuit breaker arranged on a low-volt side of the DC-DC voltage converter with a first predetermined reference voltage $U_{ref}$, and a first measuring unit, designed to start a first time measurement when a pair of the circuit breakers in the full bridge is switched on by means of the actuating unit and to terminate the first time measurement when the first voltage $U_{LV}$ exceeds the first reference voltage $U_{ref}$: $U_{LV} > U_{ref}$, wherein the first measuring unit is additionally designed to output an ascertained first measurement period of the first time measurement to the actuating unit, and wherein the actuating unit is designed to actuate the circuit breakers in accordance with the ascertained first measurement period.

In a further embodiment, the circuit arrangement further comprises: the actuating unit, designed to actuate circuit breakers arranged on a low-volt side of the DC-DC voltage converter, an ascertaining unit, designed to ascertain a second reference voltage $U'_{ref}$, at least one second comparison unit, designed to compare a second voltage $U'_{LV}$ dropping across a circuit breaker arranged on the low-volt side of the DC-DC voltage converter with the second reference voltage $U'_{ref}$, and a second measuring unit, designed to start a second time measurement when the circuit breaker is switched off by means of the actuating unit and to terminate the second time measurement when the value $|U'_{LV}|$ of the second voltage $U'_{LV}$ exceeds the value $|U'_{ref}|$ of the second reference voltage $U'_{ref}$: $|U'_{LV}| > |U'_{ref}|$, and to start a third time measurement when the circuit breaker is switched on by means of the actuating unit and to terminate the third time measurement when the value $|U'_{LV}|$ of the second voltage $U'_{LV}$ falls below the value $|U'_{ref}|$ of the second reference voltage $U'_{ref}$: $|U'_{LV}| < |U'_{ref}|$, wherein the second measuring unit is additionally designed to output an ascertained second measurement period of the second time measurement and an ascertained third measurement period of the third time measurement to the actuating unit, and wherein the actuating unit is designed to actuate the circuit breaker in accordance with the ascertained second and third measurement period.

In a further embodiment, the at least one first comparison unit is formed as a comparator or comprises a potentiometer.

In a further embodiment, the circuit further comprises a pulse-width modulator for generating the first reference voltage $U_{ref}$.

Another embodiment provides a circuit arrangement for ascertaining switching times for a DC-DC voltage converter, comprising: an actuating unit, designed to actuate circuit breakers arranged on a low-volt side of the DC-DC voltage converter, an ascertaining unit, designed to ascertain a reference voltage $U'_{ref}$, at least one comparison unit, designed to compare a voltage $U'_{LV}$ dropping across a circuit breaker arranged on the low-volt side of the DC-DC voltage converter with the reference voltage $U'_{ref}$, and a measuring unit, designed to start a first time measurement when the circuit breaker is switched off by means of the actuating unit and to terminate the first time measurement when the value $|U'_{LV}|$ of the voltage $U'_{LV}$ exceeds the value $|U'_{ref}|$ of the reference voltage $U'_{ref}$: $|U'_{LV}| > |U'_{ref}|$, and to start a second time measurement when the circuit breaker is switched on by means of the actuating unit and to terminate the second time measurement when the value $|U'_{LV}|$ of the voltage $U'_{LV}$ falls below the value $|U'_{ref}|$ of the reference voltage $U'_{ref}$: $|U'_{LV}| < |U'_{ref}|$, wherein the measuring unit is additionally designed to output an ascertained first measurement period of the first time measurement and an ascertained second measurement period of the second time measurement to the actuating unit, and wherein the actuating unit is designed to actuate the circuit breaker in accordance with the ascertained first and second measurement period.

In a further embodiment, the at least one comparison unit is formed as a comparator.

In a further embodiment, the ascertaining unit comprises a tri-state buffer and a D-flip-flop.

Another embodiment provides a DC-DC voltage converter for converting a voltage of a high-volt side of the DC-DC voltage converter into a voltage of a low-volt side of the DC-DC voltage converter and/or vice versa, comprising circuit breakers in a full bridge on the high-volt side of the DC-DC voltage converter and/or circuit breakers on the low-volt side of the DC-DC voltage converter, wherein the DC-DC voltage converter has a circuit arrangement as disclosed above for controlling the circuit breakers in the full bridge on the high-volt side of the DC-DC voltage converter and/or the circuit breakers on the low-volt side of the DC-DC voltage converter.

In a further embodiment, the circuit breakers arranged on the high-volt side of the DC-DC voltage converter and/or the circuit breakers arranged on the low-volt side of the DC-DC voltage converter are formed as metal-oxide semiconductor field-effect transistors.

Another embodiment provides a vehicle on-board power supply system comprising a DC-DC voltage converter as disclosed above.

Another embodiment provides a method for ascertaining switching times for a DC-DC voltage converter, wherein the method comprises the following steps: starting a time measurement when a pair of circuit breakers in a full bridge, which are arranged on a high-volt side of the DC-DC voltage converter, is switched on by means of an actuating unit, comparing a voltage $U_{LV}$ dropping across a circuit breaker arranged on a low-volt side of the DC-DC voltage converter with a predetermined reference voltage $U_{ref}$, terminating the time measurement when the voltage $U_{LV}$ exceeds the reference voltage $U_{ref}$: $U_{LV} > U_{ref}$, outputting an ascertained measurement period of the time measurement to the actuating unit, and actuating the circuit breakers in accordance with the ascertained measurement period.

Another embodiment provides a method for ascertaining switching times for a DC-DC voltage converter, wherein the method comprises the following steps: ascertaining a reference voltage $U'_{ref}$, starting a first time measurement when a circuit breaker arranged on a low-volt side of the DC-DC voltage converter is switched off by means of an actuating unit, comparing a voltage $U'_{LV}$ dropping across the circuit breaker with the reference voltage $U'_{ref}$, terminating the first time measurement when the value $|U'_{LV}|$ of the voltage $U'_{LV}$ exceeds the value $|U'_{ref}|$ of the reference voltage $U'_{ref}$: $|U'_{LV}| > |U'_{ref}|$, outputting an ascertained first measurement period of the first time measurement to the actuating unit, and actuating the circuit breaker in accordance with the ascertained first measurement period.

In a further embodiment, the method further comprises the following steps: starting a second time measurement when the circuit breaker is switched on by means of the actuating unit, comparing the voltage $U'_{LV}$ dropping across the circuit breaker with the reference voltage $U'_{ref}$, terminating the second time measurement when the value $|U'_{LV}|$ of the voltage $U'_{LV}$ falls below the value $|U'_{ref}|$ of the reference voltage $U'_{ref}$: $|U'_{LV}| < |U'_{ref}|$, outputting an ascertained second measurement period of the second time measurement to the actuating unit, and actuating the circuit breaker in accordance with the ascertained second measurement period.

BRIEF DESCRIPTION OF THE DRAWINGS

Example embodiments of the invention are explained in greater detail below with reference to the accompanying figures, in which:

FIG. 4 shows a voltage/time graph of a circuit breaker; and

FIGS. 5A and 5B show a flow diagram of a method for ascertaining switching times for a DC-DC voltage converter in accordance with an embodiment of the invention.

DETAILED DESCRIPTION

Figure 1:
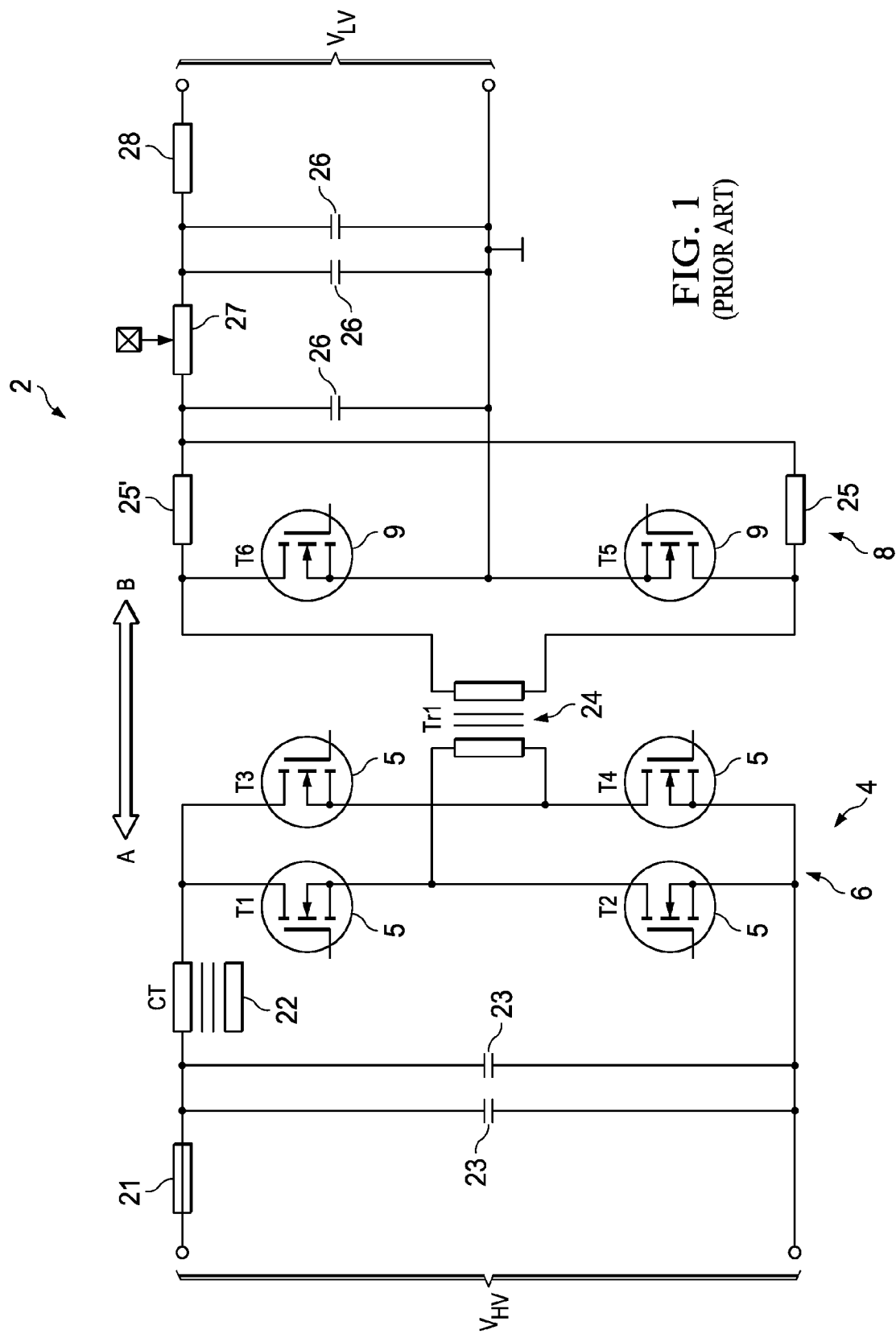
FIG. 1 shows a schematic circuit diagram of a DC-DC voltage converter.

Embodiments of the present invention provide circuit arrangements and methods for ascertaining switching times for a DC-DC voltage converter that enable improved operation of a DC-DC voltage converter, as well as corresponding DC-DC voltage converters.

In accordance with a first aspect of the application, a circuit arrangement for ascertaining switching times for a DC-DC voltage converter comprises an actuating unit, which is designed to actuate circuit breakers in a full bridge, which are arranged on a high-volt side of the DC-DC voltage converter. In addition, the circuit arrangement comprises at least one first comparison unit, which is designed to compare a first voltage $U_{LV}$ dropping across a circuit breaker arranged on a low-volt side of the DC-DC voltage converter with a first predetermined reference voltage $U_{ref}$. Furthermore, the circuit arrangement comprises a first measuring unit, designed to start a first time measurement when, or as soon as, a pair of the circuit breakers in the full bridge is switched on by means of the actuating unit and to terminate the first time measurement when, or as soon as, the first voltage $U_{LV}$ exceeds the first reference voltage $U_{ref}$: $U_{LV} > U_{ref}$. The first measuring unit is additionally designed to output an ascertained first measurement period of the first time measurement to the actuating unit, and the actuating unit is designed to actuate the circuit breakers in accordance with the ascertained first measurement period.

The circuit breakers in the full bridge, which are arranged on the high-volt side of the DC-DC voltage converter, are actuated in pairs, e.g., by pulse-width modulated actuation signals. Here, the measurement period of the time measurement ascertained by the measuring unit is used to adjust the duty factor, that is to say the duty cycle of the pulse-width modulated actuation signals and therefore the switched-on and switched-off time of the respective circuit breakers. This is true similarly for the aspects of the invention to be described hereinafter.

The term high-volt side is used here and hereinafter synonymously with the term high-voltage side. Furthermore, the term low-volt side is used here and hereinafter synonymously with the term low-voltage side.

The circuit arrangement according to the specified embodiment enables an improved operation of the DC-DC voltage converter by the provision of the first measuring unit, which is designed accordingly, and of the actuating unit, which is designed to actuate the circuit breakers in accordance with the ascertained first measurement period. By means of the specified circuit arrangement, it is possible to measure the delay time between the actuation of the full bridge and the moment at which the generated voltage occurs on the low-volt side. Tolerances in the switching behavior of the components, in particular of the circuit breakers, for example due to temperature fluctuations, ageing and manufacturing tolerances, can thus be ascertained automatically, and improved or optimized timing adjustments derived therefrom can be used to actuate the circuit breakers. This advantageously enables an increase in the efficacy and a more stable operation of the DC-DC voltage converter. Here, the switching behavior is ascertained during running operation of the DC-DC voltage converter, wherein merely a voltage measurement is necessary, but no current measurement.

In one embodiment of the circuit arrangement the actuating unit is additionally designed to actuate circuit breakers arranged on a low-volt side of the DC-DC voltage converter. Further, the circuit arrangement comprises an ascertaining unit, which is designed to ascertain a second reference voltage $U'_{ref}$. In addition, the circuit arrangement comprises at least one second comparison unit, which is designed to compare a second voltage $U'_{LV}$ dropping across a circuit breaker arranged on the low-volt side of the DC-DC voltage converter with the second reference voltage $U'_{ref}$. Furthermore, the circuit arrangement comprises a second measuring unit, designed to start a second time measurement when, or as soon as, the circuit breaker is switched off by means of the actuating unit and to terminate the second time measurement when, or as soon as, the value $|U'_{LV}|$ of the second voltage $U'_{LV}$ exceeds the value $|U'_{ref}|$ of the second reference voltage $U'_{ref}$: $|U'_{LV}|>|U'_{ref}|$.

In addition, the second measuring unit is designed to start a third time measurement when, or as soon as, the circuit breaker is switched on by means of the actuating unit and to terminate the third time measurement when, or as soon as, the value $|U'_{LV}|$ of the second voltage $U'_{LV}$ falls below the value $|U'_{ref}|$ of the second reference voltage $U'_{ref}$: $|U'_{LV}|<|U'_{ref}|$. The second measuring unit is additionally designed to output an ascertained second measurement period of the second time measurement and an ascertained third measurement period of the third time measurement to the actuating unit, and the actuating unit is designed to actuate the circuit breaker in accordance with the ascertained second and third measurement period.

In one embodiment of the circuit arrangement the at least one first comparison unit is formed as a comparator. In a further embodiment the at least one first comparison unit may comprise a potentiometer. Both embodiments allow the dropping first voltage $U_{LV}$ to be compared in a simple manner with the first reference voltage $U_{ref}$.

Furthermore, the circuit arrangement in a further embodiment may comprise a pulse-width modulator for generating the first reference voltage $U_{ref}$. The first reference voltage $U_{ref}$ may be generated here from a pulse-width modulated voltage signal, generated by the pulse-width modulator, by means of subsequent low-pass filtering, wherein the magnitude of the first reference voltage $U_{ref}$ can be adjusted in a manner dependent on the duty factor of the pulse-width modulated voltage signal.

The duty factor or the magnitude of the reference voltage is adjusted or predefined by way of example in a manner dependent on the desired voltage value on the low-volt side of the DC-DC voltage converter. If a voltage conversion takes place from the low-volt side of the DC-DC voltage converter into the high-volt side of the DC-DC voltage converter, the duty factor or the reference voltage is thus adjusted or predefined by way of example in a manner dependent on the desired voltage value on the high-volt side of the DC-DC voltage converter. This is true similarly for the aspects of the invention to be described hereinafter.

In accordance with a second aspect of the application a circuit arrangement for ascertaining switching times for a DC-DC voltage converter is provided, which comprises an actuating unit, which is designed to actuate circuit breakers arranged on a low-volt side of the DC-DC voltage converter. Further, the circuit arrangement comprises an ascertaining unit, which is designed to ascertain a reference voltage $U'_{ref}$. In addition, the circuit arrangement comprises at least one comparison unit, which is designed to compare a voltage $U'_{LV}$ dropping across a circuit breaker arranged on the low-volt side of the DC-DC voltage converter with the reference voltage $U'_{ref}$. Furthermore, the circuit arrangement comprises a measuring unit, designed to start a first time measurement when, or as soon as, the circuit breaker is switched off by means of the actuating unit and to terminate the first time measurement when, or as soon as, the value $|U'_{LV}|$ of the second voltage $U'_{LV}$ exceeds the value $|U'_{ref}|$ of the second reference voltage $U'_{ref}$: $|U'_{LV}|>|U'_{ref}|$. In addition, the measuring unit is designed to start a second time measurement when, or as soon as, the circuit breaker is switched on by means of the actuating unit and to terminate the second time measurement when, or as soon as, the value $|U'_{LV}|$ of the second voltage $U'_{LV}$ falls below the value $|U'_{ref}|$ of the second reference voltage $U'_{ref}$: $|U'_{LV}|<|U'_{ref}|$. The measuring unit is additionally designed to output an ascertained first measurement period of the first time measurement and an ascertained second measurement period of the second time measurement to the actuating unit, and the actuating unit is designed to actuate the circuit breaker in accordance with the ascertained first and second measurement period.

The circuit arrangement according to the specified embodiment again allows an improved operation of the DC-DC voltage converter, since tolerances in the switching behavior of the circuit breaker arranged on the low-volt side are ascertained, and optimized timing adjustments, that is to say a time-lapse adjustment for the actuating unit, are determined. The switched-on and switched-off times of the circuit breakers are determined for this purpose and are output to the actuating unit.

The at least one comparison unit is formed as a comparator in one embodiment of the circuit arrangement. In a further embodiment the ascertaining unit comprises a tristate buffer and a D-flip-flop. This makes it possible to ascertain the reference voltage $U'_{ref}$ in a simple manner.

In accordance with a third aspect of the invention a DC-DC voltage converter for converting a voltage of a high-volt side of the DC-DC voltage converter into a voltage of a low-volt side of the DC-DC voltage converter and/or vice versa is provided. Here, the DC-DC voltage converter comprises a full bridge with circuit breakers on the high-volt side and/or circuit breakers on the low-volt side of the DC-DC voltage converter. Further, the DC-DC voltage converter has one of the above-described circuit arrangements for controlling the circuit breakers in the full bridge on the high-volt side of the DC-DC voltage converter and/or the circuit breakers on the low-volt side of the DC-DC voltage converter.

Here, the DC-DC voltage converter may provide the advantages specified in conjunction with the corresponding circuit arrangement, and these advantages will not be mentioned again at this juncture so as to avoid repetitions.

The circuit breakers may be formed as metal-oxide semiconductor field-effect transistors, that is to say MOSFETs, in particular as n-channel MOSFETs.

In accordance with a fourth aspect of the application a vehicle on-board power supply system is provided, which comprises an above-described DC-DC voltage converter. The vehicle on-board power supply system is part of an electric vehicle or hybrid vehicle by way of example. Furthermore, a DC-DC voltage converter according to one of the above-mentioned embodiments may be part of a switching-mode power supply.

In accordance with a fifth aspect of the application, a method for ascertaining switching times for a DC-DC voltage converter is provided, wherein the method comprises the following steps. A time measurement is started when, or as soon as, a pair of circuit breakers in a full bridge, which arranged on a high-volt side of the DC-DC voltage converter, is switched on by means of an actuating unit. In addition, a voltage $U_{LV}$ dropping across a circuit breaker arranged on a low-volt side of the DC-DC voltage converter is compared with a predetermined reference voltage $U_{ref}$. Furthermore, the time measurement is terminated when, or as soon as, the first voltage $U_{LV}$ exceeds the first reference voltage $U_{ref}$: $U_{LV}>U_{ref}$, and an ascertained measurement period of the time measurement is output to the actuating unit. Furthermore, the circuit breakers are actuated in accordance with the ascertained measurement period.

In one embodiment the method further comprises the following method steps. A further reference voltage $U'_{ref}$ is ascertained and a further time measurement is started when, or as soon as, a circuit breaker arranged on a low-volt side of the DC-DC voltage converter is switched off by means of the actuating unit. In addition, a further voltage $U'_{LV}$ dropping across the circuit breaker is compared with the further reference voltage $U'_{ref}$, and the further time measurement is terminated when, or as soon as, the value $|U'_{LV}|$ of the further voltage $U'_{LV}$ exceeds the value $|U'_{ref}|$ of the further reference voltage $U'_{ref}$: $|U'_{LV}|>|U'_{ref}|$. Further, an ascertained further measurement period of the further time measurement is output to the actuating unit, and the circuit breaker is actuated in accordance with the ascertained further measurement period.

In a further embodiment the method also comprises the following method steps. A further time measurement is started when, or as soon as, the circuit breaker is switched on by means of the actuating unit. In addition, the further voltage $U'_{LV}$ dropping across the circuit breaker is compared with the further reference voltage $U'_{ref}$, and the further time measurement is terminated when, or as soon as, the value $|U'_{LV}|$ of the further voltage $U'_{LV}$ falls below the value $|U'_{ref}|$ of the further reference voltage $U'_{ref}$: $|U'_{LV}|<|U'_{ref}|$. Furthermore, an ascertained further measurement period of the further time measurement is output to the actuating unit, and the circuit breaker is actuated in accordance with the ascertained further measurement period.

Here, the method can be performed in particular by means of a circuit arrangement according to one of the first-mentioned embodiments.

In accordance with a sixth aspect of the application a further method for ascertaining switching times for a DC-DC voltage converter is provided, wherein the method comprises the following steps. A reference voltage $U'_{ref}$ is ascertained and a first time measurement is started when, or as soon as, a circuit breaker arranged on a low-volt side of the DC-DC voltage converter is switched off by means of an actuating unit. In addition, a voltage $U'_{LV}$ dropping across the circuit breaker is compared with the reference voltage $U'_{ref}$, and the first time measurement is terminated when, or as soon as, the value $|U'_{LV}|$ of the voltage $U'_{LV}$ exceeds the value $|U'_{ref}|$ of the reference voltage $U'_{ref}$: $|U'_{LV}|>|U'_{ref}|$. Further, an ascertained first measurement period of the first time measurement is output to the actuating unit, and the circuit breaker is actuated in accordance with the ascertained first measurement period.

Here, the method can be performed in particular by means of a circuit arrangement according to one of the second-mentioned embodiments.

Embodiments of the specified methods may provide the advantages already specified in conjunction with the corresponding circuit arrangements, and these advantages will not be mentioned again at this juncture so as to avoid repetitions.

Furthermore, the last-mentioned method may additionally comprise the following steps. A second time measurement is started when, or as soon as, the circuit breaker is switched on by means of the actuating unit. In addition, a voltage $U'_{LV}$ dropping across the circuit breaker is compared with the reference voltage $U'_{ref}$, and the second time measurement is terminated when, or as soon as, the value $|U'_{LV}|$ of the voltage $U'_{LV}$ falls below the value $|U'_{ref}|$ of the reference voltage $U'_{ref}$: $|U'_{LV}|<|U'_{ref}|$. Furthermore, an ascertained second measurement period of the second time measurement is output to the actuating unit, and the circuit breaker is actuated in accordance with the ascertained second measurement period.

In one embodiment of the method two further reference voltages $U'_{ref,1}$ and $U'_{ref,2}$ can be ascertained, wherein $|U'_{ref,1}|<|U'_{ref,2}|$. The first time measurement is terminated in this embodiment when, or as soon as, the value $|U'_{LV}|$ of the voltage $U'_{LV}$ exceeds the value $|U'_{ref}|$ of the reference voltage $U'_{ref,1}$: $|U'_{LV}|>|U'_{ref,1}|$ and the second time measurement is terminated when, or as soon as, the value $|U'_{LV}|$ of the voltage $U'_{LV}$ falls below the value $|U'_{ref,2}|$ of the reference voltage $U'_{ref,2}$: $|U'_{LV}|<|U'_{ref,2}|$.

FIG. 1 shows a schematic circuit diagram of a DC-DC voltage converter 2.

The DC-DC voltage converter 2 is formed as a bidirectional converter, which can convert a first DC voltage $V_{HZ}$ or $U_{HV}$ into a second, lower DC voltage $V_{LV}$ or $U_{LV}$ and vice versa. This is shown schematically in FIG. 1 by means of an arrow A for the conversion of the second DC voltage into the first, higher DC voltage, wherein the DC-DC voltage converter 2 functions here as an up converter, which is also referred to as a boost converter. The conversion of the first DC voltage into the second, lower DC voltage is shown by means of an arrow B, wherein the DC-DC voltage converter 2 functions here as a down converter, which is also referred to as a buck converter.

The DC-DC voltage converter 2 for this purpose has a full bridge on a high-volt side 4 of a transformer 24, the full bridge comprising four circuit breakers 5, wherein the circuit breakers are formed in the shown embodiment as n-channel MOSFETs T1, T2, T3 and T4. The transformer 24 by way of example has a transmission factor between 2 and 5.

In addition, a fuse element 21 is arranged in the form of a short-circuit fuse on the high-volt side 4 of the DC-DC voltage converter 2. Furthermore, two capacitors 23, which function as filters for high-frequency voltage components, and a current measuring element 22, which is also referred to as a current transformer, are located on the high-volt side 4.

Two circuit breakers 9 are arranged on a low-volt side 8 of the transformer 24 and are likewise formed as n-channel MOSFETs T5 and T6. The drain-side terminal of the MOSFET T5 is connected here to an inductor 25, and the drain-side terminal of the MOSFET T6 is connected here to a further inductor 25'. The low-volt side 8 of the DC-DC voltage converter 2 therefore forms what is known as an active current doubler rectifier.

In addition, three capacitors 26 in the form of filter elements and also a current measuring element 27 are arranged on the low-volt side 8 of the DC-DC voltage converter 2. Further, a filter element 28 in the form of a further inductor is arranged on the low-volt side 8.

By way of example, the DC-DC voltage converter 2 is part of a vehicle on-board power supply system (not illustrated in greater detail), for example of an electric vehicle or a hybrid vehicle, wherein the vehicle in particular may be a passenger car.

On the high-volt side 4, the DC-DC voltage converter 2 may be connected by way of example to a generator belonging to the vehicle, wherein the generator can also be used as an electric motor drive as the result of a switchover, or to a first accumulator, for example in the form of a lithium-ion accumulator. On the low-volt side 8, the DC-DC voltage converter 2 may be connected by way of example to a lead accumulator of the vehicle. The voltage $V_{HV}$ for example is between 100 V and 800 V, and the voltage $V_{LV}$ for example is between 6 V and 14 V.

Figure 2:
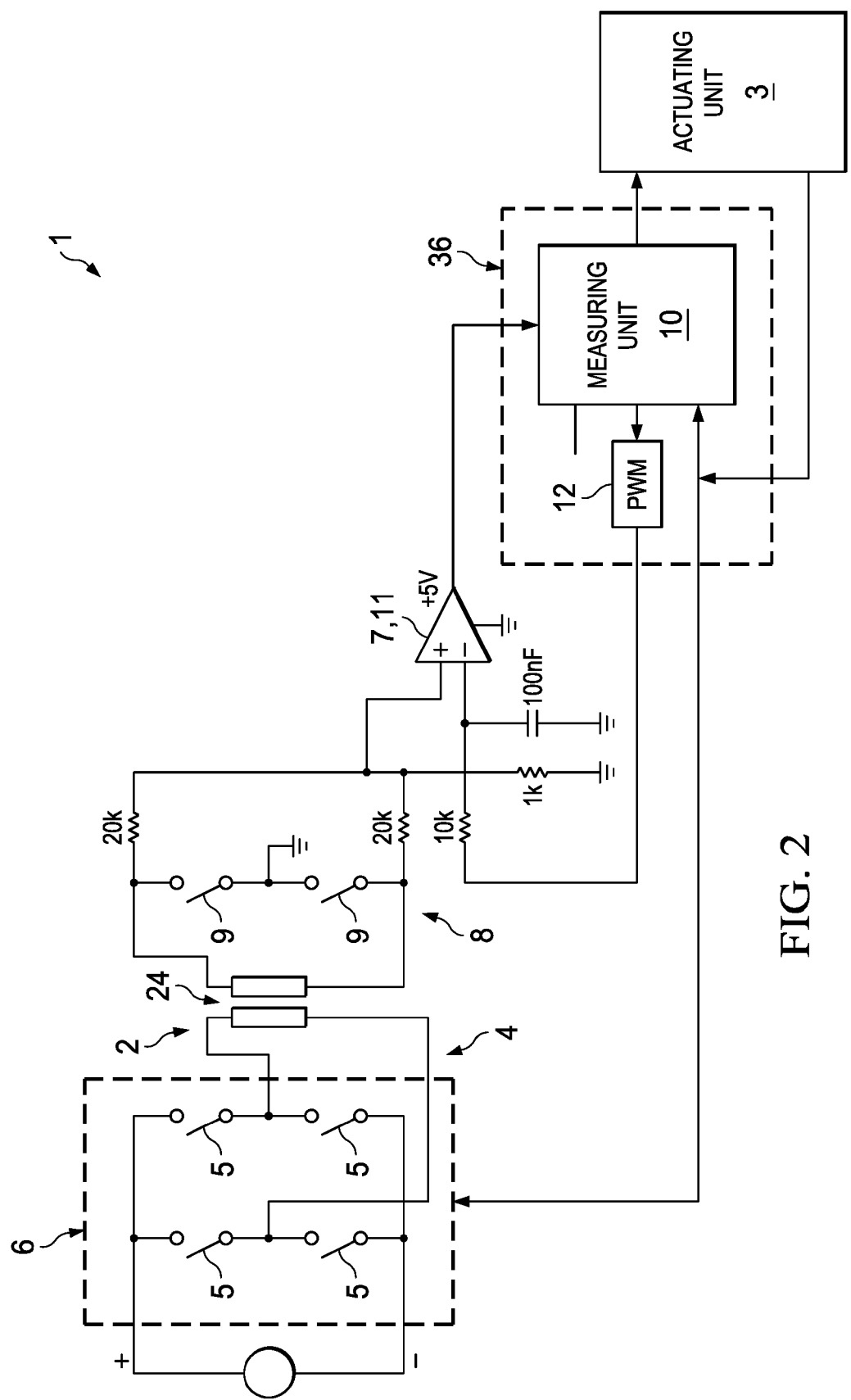
FIG. 2 shows a block diagram of a circuit arrangement in accordance with a first embodiment of the application.

FIG. 2 shows a block diagram of a circuit arrangement 1 for ascertaining switching times for a DC-DC voltage converter 2 in accordance with a first embodiment of the application. For reasons of clarity, not all the components of the DC-DC voltage converter 2 illustrated in FIG. 1 are shown in FIG. 2. Components having the same function as in FIG. 1 are denoted by the same reference signs and will not be explained again hereinafter.

The circuit arrangement 1 has an actuating unit 3, which is designed to actuate the circuit breakers 5 in the full bridge 6, which are arranged on the high-volt side 4 of the DC-DC voltage converter 2. The circuit breakers 5 are illustrated here in FIG. 2 merely schematically and are formed as MOSFETs.

In addition, the circuit arrangement 1 has a comparison unit 7, which is designed to compare a voltage $U_{LV}$ dropping across a circuit breaker 9 arranged on the low-volt side 8 of the DC-DC voltage converter 2 with a reference voltage $U_{ref}$. The circuit breakers 9 are also illustrated merely schematically in FIG. 2 and are formed as MOSFETs. The comparison unit 7 is formed as a comparator 11 in the shown embodiment, wherein the drain-side terminals of the circuit breakers 9 are connected via a resistor to the positive input of the comparator 11. The negative input of the comparator 11 is connected in the shown embodiment via a further resistor to a pulse-width modulator 12, which is used to generate the reference voltage $U_{ref}$.

In addition, the circuit arrangement 1 has a measuring unit 10, designed to start a time measurement when a pair of the circuit breakers 5 in the full bridge 6, that is to say in the shown embodiment T1/T4 or T2/T3, is switched on by means of the actuating unit 3. To this end, an actuation signal output by the actuating unit 3 to the circuit breakers 5 is additionally transmitted to the measuring unit 10. Here, merely one of four signal lines between the actuating unit 3 and the full bridge 6 is illustrated schematically in FIG. 2 for reasons of clarity, said signal lines being provided in order to actuate the four circuit breakers 5. Further, the measuring unit 10 is designed to terminate the time measurement when $U_{LV} > U_{ref}$. To this end, the measuring unit 10 is coupled to the output of the comparator 11. If $U_{LV} > U_{ref}$, the output signal of the comparator 11 has a high level, whereby the time measurement is terminated, whereas the output signal of the comparator 11 has a low level when $U_{LV} \leq U_{ref}$.

The measuring unit 10 is additionally designed to output an ascertained measurement period of the time measurement to the actuating unit 3, and the actuating unit 3 is designed to actuate the circuit breakers 5 in accordance with the ascertained measurement period.

In the shown embodiment the measuring unit 10 and the pulse-width modulator 12 are illustrated as a common switching block in order to ascertain the switching times for the DC-DC voltage converter 2. The delay time between the actuation of the H-bridge or full bridge 6 and the moment at which the generated voltage occurs on the low-volt side 8 is measured by means of the shown circuit arrangement 1. Accordingly, the delay time between the switch-off of the full bridge 6 to the moment at which there is no longer any voltage on the low-volt side 8 can also be determined.

Figure 3:
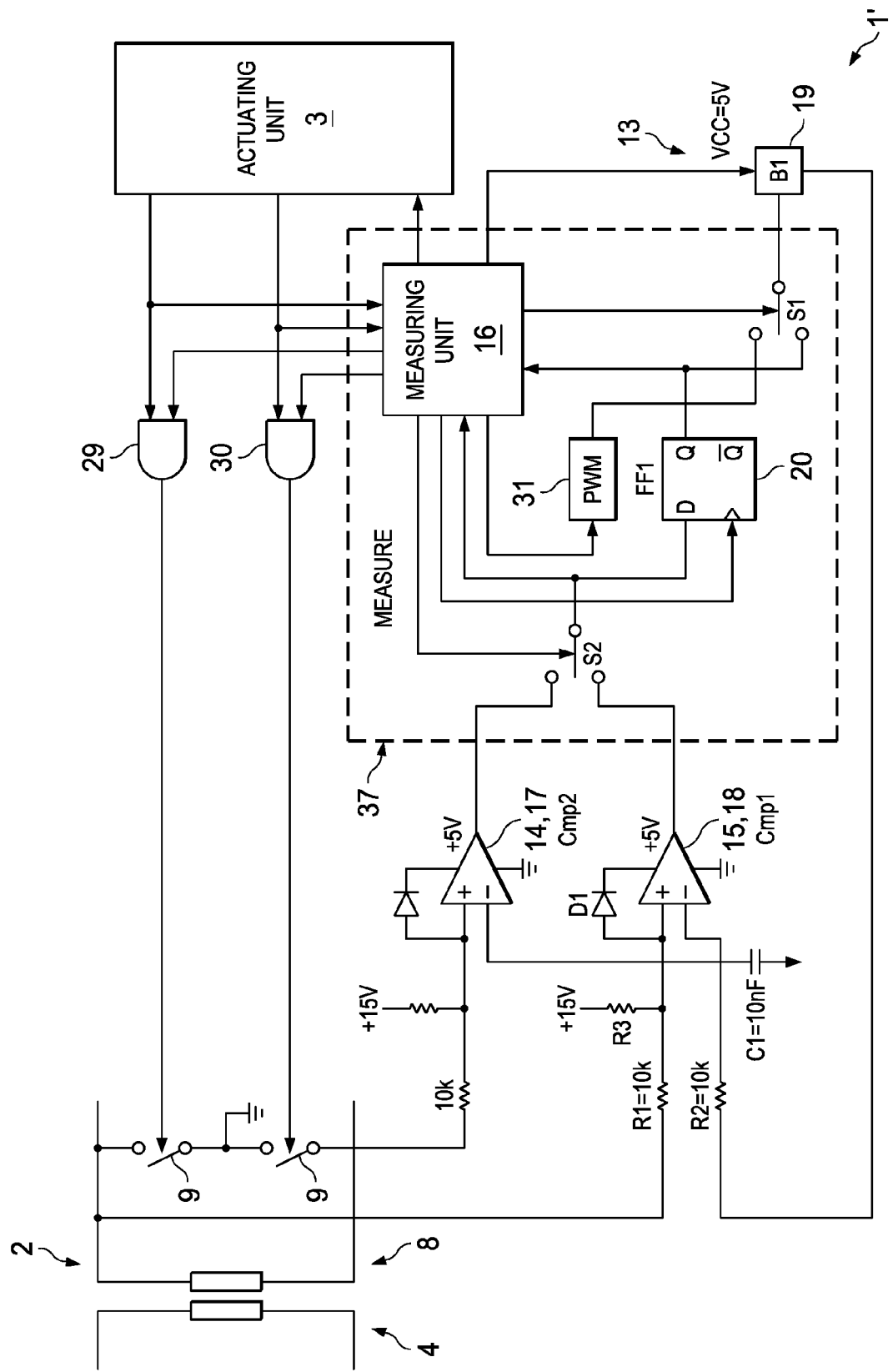
FIG. 3 shows a block diagram of a circuit arrangement in accordance with a second embodiment of the application.

FIG. 3 shows a block diagram of a circuit arrangement 1' for ascertaining switching times for a DC-DC voltage converter 2 in accordance with a second embodiment of the application. Again, for reasons of clarity, not all the components of the DC-DC voltage converter 2 shown in FIG. 1 are illustrated. Components having the same functions as in the previous figures are denoted by the same reference signs and will not be explained again hereinafter.

The circuit arrangement 1', in the shown embodiment, has an actuating unit 3, which is designed to actuate the circuit breakers 9 in the form of MOSFETs arranged on the low-volt side of the DC-DC voltage converter 2. The actuating unit 3 is connected for this purpose to the gate terminals of the circuit breakers 9, in each case via an And gate 29 or 30, wherein a first input of the And gate 29 and a first input of the And gate 30 is coupled to the actuating unit 3.

Further, the circuit arrangement 1' has an ascertaining unit 13, which is designed to ascertain a reference voltage $U'_{ref}$. The ascertaining unit 13 for this purpose has a tri-state buffer 19, which is also denoted as B1, and a D-flip-flop 20, which is also denoted as FF1. Further details for ascertaining the reference voltage $U'_{ref}$ will be explained in greater detail hereinafter.

The tri-state buffer 19 is connected on the input side to a switch S1. The switch S1 can be switched here between a first position, which is also referred to as "measure", and a second position, which is also referred to as "fix reference voltage $U'_{ref}$". Furthermore, the switch input of the tri-state buffer 19 is connected to a logic element or a measuring unit 16 of the circuit arrangement 1'. The data input of the D-flip-flop 20 is likewise connected to the measuring unit 16. Furthermore, the clock input of the D-flip-flop 20 is connected to the measuring unit 16. The Q-output of the D-flip-flop 20 is connected to the switch S1 and to the measuring unit 16.

In the shown embodiment the D-flip-flop 20, the switch S1 and the measuring unit 16 form a circuit block 37, which additionally comprises a pulse-width modulator 31 for generation of the reference voltage $U'_{ref}$ and a second switch S2. The pulse-width modulator 31 is connected on the input side to the measuring unit 16 and on the output side to the second position of the switch S1. The second switch S2 can be switched between a first position, which is connected to the output of a first comparator 18, which is also referred to as Cmp1, and a second position, which is connected to the output of a second comparator 17, which is also referred to as Cmp2, and is connected to the data input of the D-flip-flop 20. For actuation of the first switch S1 and the second switch S2, these are each connected to the measuring unit 16.

Furthermore, the measuring unit 16 is connected to a second input of the first And gate 29 and to a second input of the second And gate 30.

The comparators 17 and 18 in the shown embodiment form two comparison units 14 and 15 of the circuit arrangement 1', which are designed to compare a voltage $U'_{LV}$ dropping across one of the circuit breakers 9 arranged on the low-volt side 8 of the DC-DC voltage converter 2 with the reference voltage $U'_{ref}$. The positive input of the first comparator 18 is connected via a first resistor R1 to the drain-side terminal of the first circuit breaker 9.

The positive input of the second comparator 17 is connected via a further resistor to the drain-side terminal of the second circuit breaker 9. The negative inputs of the two comparators 17 and 18 are each connected via a further resistor R2 to the output of the tri-state buffer 19.

The measuring unit 16 is designed to start a first time measurement when one of the circuit breakers 9 is switched off by means of the actuating unit 3 and to terminate the first time measurement when $|U'_{LV}| > |U'_{ref}|$. Furthermore, the measuring unit 16 is designed to start a second time measurement when the circuit breaker 9 is switched on by means of the actuating unit 3 and to terminate the second time measurement when $|U'_{LV}| < |U'_{ref}|$.

The measuring unit 16 is additionally designed to output an ascertained first measurement period of the first time measurement and an ascertained second measurement period of the second time measurement to the actuating unit 3. To this end, the measuring unit 16 is connected to the actuating unit 3, wherein the actuating unit 3 is designed to actuate the circuit breakers 9 in accordance with the ascertained first and second measurement period.

Here, the operating principle of the circuit arrangement 1' is such that, when the switch S1 is switched into the "measure" position and the tri-state buffer 19 is activated, the respective comparator 17 or 18, the D-flip-flop 20 and the parts attached thereto function as a control circuit. The output of the D-flip-flop 20 constitutes the voltage at the drain terminal of the respective circuit breaker 9. The duty factor is determined for this purpose, as will be explained in greater detail in conjunction with the following figures. When the control circuit and the tri-state buffer 19 are deactivated, the voltage remains practically constant until the next measurement cycle is begun.

The measuring unit 16 can therefore measure the voltage at the circuit breakers 9 during a desired time period. Proceeding from this value, the measuring unit 16 can determine a reference voltage $U'_{ref}$, which is applied to the respective comparator input once the switch S1 is moved into the "fix reference voltage $U'_{ref}$" position. The comparator output then delivers a signal, which allows the measuring unit 16 to determine the switched-on and switched-off times of the circuit breakers 9. The switching times are measured here by switching the respective circuit breaker 9 on or off for a short period during the conducting phase, as will be explained in greater detail in conjunction with the following figure. During this time, the drain-source voltage is always negative. The body diode inherent to the circuit breaker 9 in the form of the MOSFET takes over when the circuit breaker 9 is switched off, such that the operation of the DC-DC voltage converter 2 can be continued. The voltage is dependent either on the forward voltage of the body diode, more specifically in the switched-off state of the circuit breaker 9, or on the product of current and on-state DC resistance $R_{DS,on}$ in the switched-on state of the circuit breaker 9. The time that passes between the two specified states is the switched-on or switched-off time respectively of the corresponding circuit breaker 9.

In the circuit arrangement 1' illustrated in FIG. 3 it is assumed that the two circuit breakers 9 demonstrate the same behavior in respect of the voltage $U_{DS}$. Should this not be the case, the shown circuit arrangement and in particular the measuring unit can be extended to the extent that the second comparator 17 is supplied with a reference voltage that is different from the reference voltage of the first comparator 18.

FIG. 4 shows a voltage/time graph, wherein the time curve of the drain source voltage $U_{DS}$ of one of the circuit breakers arranged on the low-volt side shown in FIG. 3 is plotted.

As already explained, the voltage $U_{DS}$ is given by the product from current and $R_{DS,on}$, if the circuit breaker in the form of a MOSFET is switched on. This corresponds to a plateau 32 of the voltage illustrated in FIG. 4. When the circuit breaker is switched off, the voltage $U_{DS}$ is given by the forward voltage of the body diode inherent to the MOSFET. This corresponds to a plateau 34 of the voltage, wherein the absolute value of the voltage in this case is greater than the absolute value when the circuit breaker is switched on.

If the circuit breaker is brought from the "on" state into the "off" state, the voltage $U_{DS}$ drops from the plateau 32 into a falling flank 33 to the plateau 34. If the circuit breaker is brought from the "off" state into the "on" state, the voltage increases again from the plateau 34 via a rising flank 35 to the plateau 32. The period of time in which the voltage falls from the plateau 32 to the plateau 34 corresponds here to the switched-off period of the circuit breaker, which is also referred to as $\Delta t_{off}$. The period of time in which the voltage rises from the plateau 34 to the plateau 32 corresponds to the switched-on period of the circuit breaker, which is also referred to as $\Delta t_{on}$.

Furthermore, two reference voltages $U_{ref,on}$ and $U_{ref,off}$ are illustrated in FIG. 4, wherein the absolute value of $U_{ref,off}$ is greater than the absolute value of $U_{ref,on}$. As already explained, the corresponding switching times of the MOSFET can be determined by means of the specified threshold values.

Figure 5A:
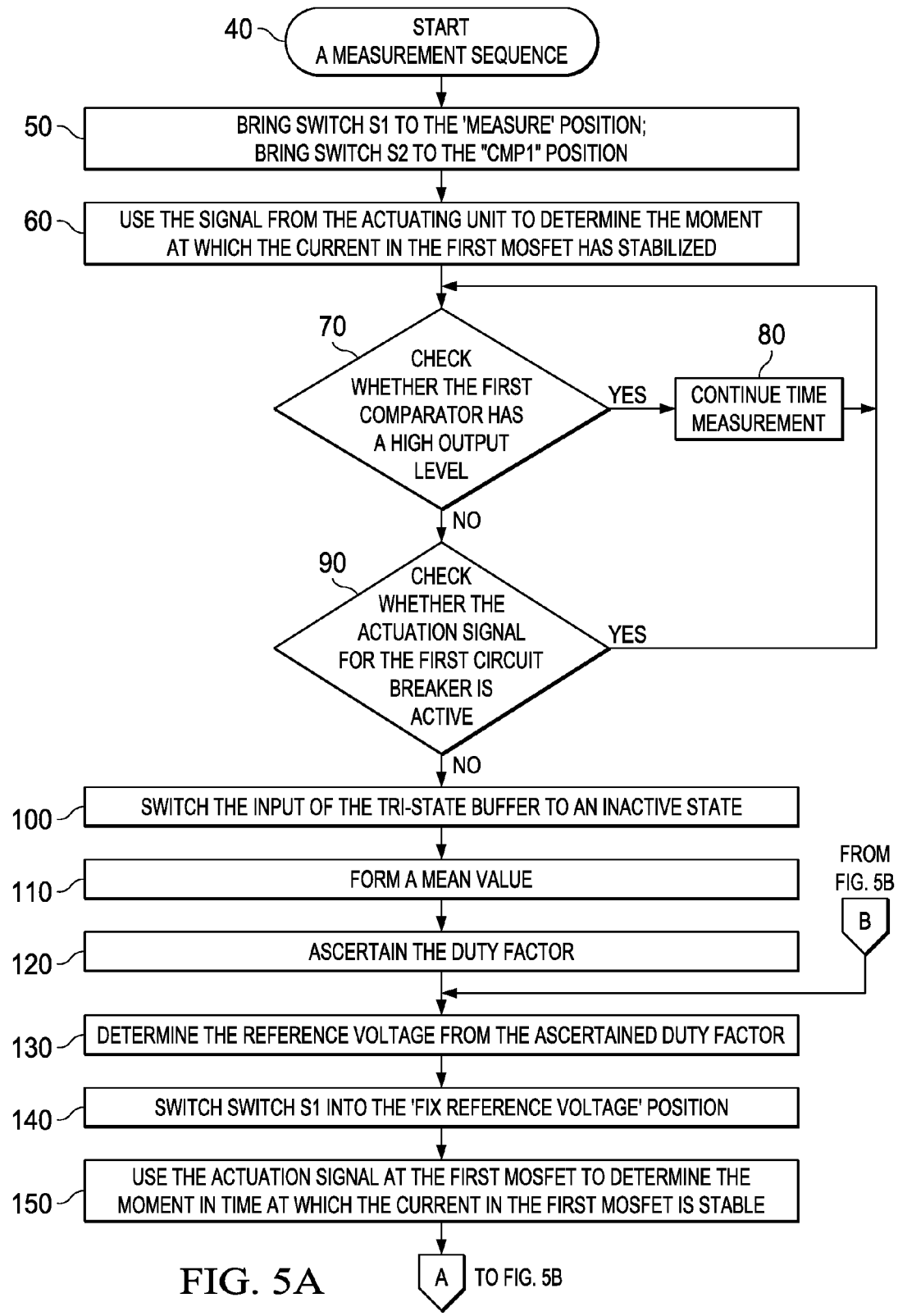

FIGS. 5A and 5B show a flow diagram of a method for ascertaining switching times for a DC-DC voltage converter in accordance with an embodiment of the application.

In one step 40, the measurement sequence for ascertaining the voltage $U_{DS}$ of the first or both MOSFETs arranged on the low-volt side of the DC-DC voltage converter is started.

To this end, the switch S1 shown in FIG. 3 is brought in a step 50 into the "measure" position, and the switch S2 is brought into the "Cmp1" position. In addition, activation signals from the measuring unit are applied to the second inputs of the two And gates.

In a step 60, the signal supplied from the actuating unit 3 is used to determine the moment at which the current in the first MOSFET has stabilized. Furthermore, in the step 60, an activation signal is transmitted from the measuring unit 16 to the tri-state buffer, and a time measurement is started.

In a step 70, it is checked whether the first comparator has a high output level and whether an actuation signal for actuating the first MOSFET is active.

If this is the case, the time measurement is continued in a step 80, provided the first comparator delivers a high output signal.

If, by contrast, this is not the case, it is checked in a step 90 whether the actuation signal for the first circuit breaker is active.

If this is the case, the process returns to step 70.

If, by contrast, this is not the case, the switching input of the tri-state buffer is shifted into an inactive state in a step 100.

Furthermore, a mean value is formed in a step 110 and the duty factor is ascertained in a step 120, that is to say the ratio between the time in which the output of the first comparator has a high value and the period of time during which the actuation signal for the first circuit breaker is active.

In a step 130, the reference voltage $U'_{ref}$ is determined from the ascertained duty factor and is output to the pulse-width modulator shown in FIG. 3 for generation of the reference voltage $U'_{ref}$.

In a step 140, the switch S1 is switched into the "fix reference voltage $U'_{ref}$" position, Furthermore, activation signals from the measuring unit are applied to the second inputs of the two And gates, and the tri-state buffer is set to the active state by means of a corresponding activation signal.

In a step 150 the actuation signal at the first MOSFET is used to determine the moment in time at which the current in the first MOSFET is stable. Furthermore, a time measurement is started in the step 150, and the first MOSFET is shifted into the switched-off state. This is achieved via an inactivation signal of the measuring unit at the second input of the corresponding And gate of the first MOSFET.

The time measurement is performed until the first comparator changes from a high output level to a low output level, as is shown by a step 160.

In a step 170, the time measurement is then terminated, and the measurement period of the first time measurement is ascertained. Here, the measurement period indicates the switched-off time of the first MOSFET.

In a step 180, the first MOSFET is switched on by means of a corresponding activation signal of the measuring unit at the second input of the And gate, and a second time measurement is started.

The time measurement is then performed until the first comparator changes from a low output signal to a high output signal, as is illustrated by a step 190.

In a step 200, the second time measurement is then terminated and the measurement period of the second time measurement is determined. This measurement period indicates the switched-on time of the first MOSFET.

In a step 210, the actuation signal at the second MOSFET is used to determine the moment in time at which the current through the second MOSFET is stable. A third time measurement is then started, and the second MOSFET is switched off.

The time measurement is performed until the second comparator changes from a high output signal to a low output signal, as is illustrated by a step 220.

In a step 230, the third time measurement is then terminated, and the measurement period of the third time measurement is determined. This indicates the switched-off time of the second MOSFET.

In a step 240, the second MOSFET is shifted again by means of a corresponding activation signal of the measuring unit at the second input of the And gate of the second MOSFET into the switched-on state, and a fourth time measurement is started.

The time measurement is performed until the second comparator changes from a low output signal into a high output signal, as is illustrated in a step 250.

In a step 260, the fourth time measurement is then terminated, and the measurement period of the fourth time measurement is determined. This indicates the switched-on time of the second MOSFET.

In a step 270, the ascertained measurement periods of the first, second, third and fourth time measurement are output to the actuating unit in the shown embodiment, and the circuit breakers are actuated in the next operating cycle of the DC-DC voltage converter in accordance with the ascertained measurement periods.

In a step 280, it is further determined in the shown embodiment whether changes in current, temperature or further operating conditions have occurred.

If this is the case, steps 130 to 270 are repeated.

If, by contrast, this is not the case, the measurement sequence is performed again for $U_{DS}$, as is illustrated by a step 290. In this case, steps 50 to 120 and then steps 130 to 270 are repeated.

What is claimed is:

1. A circuit arrangement for controlling switching times for a DC-DC voltage converter, the circuit arrangement comprising:
   an actuating unit configured to actuate circuit breakers in a full bridge, which are arranged on a high-volt side of the DC-DC voltage converter,
   at least one first comparison unit configured to compare a first voltage $U_{LV}$ dropping across a circuit breaker arranged on a low-volt side of the DC-DC voltage converter with a first predetermined reference voltage $U_{ref}$, and
   a first measuring unit configured to start a first time measurement when a pair of the circuit breakers in the full bridge is switched on by the actuating unit and to terminate the first time measurement when the first voltage $U_{LV}$ exceeds the first reference voltage $U_{ref}$: $U_{LV} > U_{ref}$,
   wherein the first measuring unit is further configured to output a first measurement period of the first time measurement to the actuating unit, and
   wherein the actuating unit is configured to actuate the circuit breakers in accordance with the first measurement period,
   wherein the actuating unit actuates circuit breakers arranged on a low-volt side of the DC-DC voltage converter,
   a second comparison unit comparing a second voltage $U'_{LV}$ dropping across a circuit breaker arranged on the low-volt side of the DC-DC voltage converter with a second predetermined reference voltage $U'_{ref}$, and
   a second measuring unit configured to:
      start a second time measurement when the circuit breaker is switched off by the actuating unit and to terminate the second time measurement when the value $|U'_{LV}|$ of the second voltage $U'_{LV}$ exceeds the value $|U'_{ref}|$ of the second reference voltage $U'_{ref}$: $|U'_{LV}| > |U'_{ref}|$, and
      start a third time measurement when the circuit breaker is switched on by the actuating unit and to terminate the third time measurement when the value $|U'_{LV}|$ of the second voltage $U'_{LV}$ falls below the value $|U'_{ref}|$ of the second reference voltage $U'_{ref}$: $|U'_{LV}| < |U'_{ref}|$,
   wherein the second measuring unit outputs a second measurement period of the second time measurement and a third measurement period of the third time measurement to the actuating unit, and
   wherein the actuating unit is configured to actuate the circuit breaker in accordance with the second and third measurement period.

2. The circuit arrangement of claim 1, wherein the at least one first comparison unit is formed as a comparator or comprises a potentiometer.

3. The circuit arrangement of claim 1, further comprising a pulse-width modulator configured to generate the first predetermined reference voltage $U_{ref}$.

4. A DC-DC voltage converter for converting a voltage of a high-volt side of the DC-DC voltage converter into a voltage of a low-volt side of the DC-DC voltage converter and/or vice versa, the DC-DC voltage converter comprising:
   at least one of (a) circuit breakers in a full bridge on the high-volt side of the DC-DC voltage converter and (b) circuit breakers on the low-volt side of the DC-DC voltage converter,
   wherein the DC-DC voltage converter comprises a circuit arrangement for controlling the circuit breakers, the circuit arrangement comprising:
      an actuating unit configured to actuate circuit breakers in a full bridge, which are arranged on a high-volt side of the DC-DC voltage converter,
      a first comparison unit configured to compare a first voltage $U_{LV}$ dropping across a circuit breaker arranged on a low-volt side of the DC-DC voltage converter with a first predetermined reference voltage $U_{ref}$, and
      a second comparison unit comparing a second voltage $U'_{LV}$ dropping across a circuit breaker arranged on the low-volt side of the DC-DC voltage converter with a second predetermined reference voltage $U'_{ref}$, and
      a measuring unit configured:

to start a first time measurement when a pair of the circuit breakers in the full bridge is switched on by the actuating unit and to terminate the first time measurement when the first voltage $U_{LV}$ exceeds the first predetermined reference voltage $U_{ref}$: $U_{LV} > U_{ref}$, start a second time measurement when the circuit breaker is switched off by the actuating unit and to terminate the second time measurement when the value $|U'_{LV}|$ of the second voltage $U'_{LV}$ exceeds the value $|U'_{ref}|$ of the second reference voltage $U'_{ref}$: $|U'_{LV}| > |U'_{ref}|$, and start a third time measurement when the circuit breaker is switched on by the actuating unit and to terminate the third time measurement when the value $|U'_{LV}|$ of the second voltage $U'_{LV}$ falls below the value $|U'_{ref}|$ of the second reference voltage $U'_{ref}$: $|U'_{LV}| < |U'_{ref}|$, wherein the first measuring unit is further configured to output an ascertained first measurement period of the first time measurement to the actuating unit, output a second measurement period of the second time measurement and a third measurement period of the third time measurement to the actuating unit, and wherein the actuating unit is configured to actuate the circuit breakers in accordance with the ascertained first measurement period, the second measurement period, and the third measurement period.

5. The DC-DC voltage converter of claim 4, wherein the circuit breakers arranged on the high-volt side of the DC-DC voltage converter and/or the circuit breakers arranged on the low-volt side of the DC-DC voltage converter are formed as metal-oxide semiconductor field-effect transistors.

* * * * *

UNITED STATES PATENT AND TRADEMARK OFFICE
CERTIFICATE OF CORRECTION

Page 1 of 1

PATENT NO. : 9,627,978 B2
APPLICATION NO. : 14/360670
DATED : April 18, 2017
INVENTOR(S) : Peter Muhlenbrock It is certified that error appears in the above-identified patent and that said Letters Patent is hereby corrected as shown below:

On the Title Page

(73) Assignee:
"CONTINENTAL AUTOMOTIVE GMBH, Hannover (DE). . . "
Change to:
"… CONTI TEMIC MICROELECTRONIC GMBH, Nuremberg (DE)…"

Signed and Sealed this
Eighteenth Day of December, 2018

Andrei Iancu
*Director of the United States Patent and Trademark Office*